United States Patent
Okano et al.

(10) Patent No.: US 10,714,247 B2
(45) Date of Patent: Jul. 14, 2020

(54) FERRITE SINTERED PLATE AND FERRITE SINTERED SHEET

(71) Applicant: TODA KOGYO CORP., Hiroshima-shi, Hiroshima-ken (JP)

(72) Inventors: Yoji Okano, Otake (JP); Makoto Sadai, Otake (JP); Shingo Honda, Otake (JP); Mitsunori Kurumada, Otake (JP); Akihiro Yoshida, Otake (JP); Kazuyoshi Kawato, Otake (JP)

(73) Assignee: TODA KOGYO CORP., Hiroshima (JP)

( * ) Notice: Subject to any disclaimer, the term of this patent is extended or adjusted under 35 U.S.C. 154(b) by 0 days.

(21) Appl. No.: 15/312,288

(22) PCT Filed: May 21, 2015

(86) PCT No.: PCT/JP2015/064593
§ 371 (c)(1),
(2) Date: Nov. 18, 2016

(87) PCT Pub. No.: WO2015/178450
PCT Pub. Date: Nov. 26, 2015

(65) Prior Publication Data
US 2017/0117075 A1 Apr. 27, 2017

(30) Foreign Application Priority Data
May 22, 2014 (JP) ................. 2014-106298

(51) Int. Cl.
*H05K 9/00* (2006.01)
*H01F 1/34* (2006.01)
*C04B 35/26* (2006.01)

(52) U.S. Cl.
CPC ......... *H01F 1/342* (2013.01); *C04B 35/2666* (2013.01); *H05K 9/00* (2013.01); *H05K 9/0075* (2013.01); *C04B 2235/3274* (2013.01); *C04B 2235/3275* (2013.01); *C04B 2235/3279* (2013.01); *C04B 2235/3282* (2013.01); *C04B 2235/3284* (2013.01); *C04B 2235/96* (2013.01)

(58) Field of Classification Search
CPC ... H01F 1/342; C04B 35/2666; C04B 35/265; C04B 35/2658; C04B 2235/3274; C04B 2235/3275; C04B 2235/3279; C04B 2235/3282; C04B 2235/3284; C04B 2235/96; C04B 2235/327; C04B 2235/3281; H05K 9/0075; Y10T 428/24479; Y10T 428/24504; Y10T 428/24521; Y10T 428/24537; Y10T 428/24545; Y10T 428/2457; Y10T 428/2462; Y10T 428/24942; Y10T 428/2495
USPC ....... 428/156, 159, 161, 163, 164, 167, 173, 428/212, 213
See application file for complete search history.

(56) References Cited

U.S. PATENT DOCUMENTS

| | | | |
|---|---|---|---|
| 2005/0199851 A1 | 9/2005 | Aoki et al. | |
| 2005/0199852 A1* | 9/2005 | Takenoshita | C01G 49/0063 252/62.57 |
| 2008/0224937 A1 | 9/2008 | Kimura et al. | |
| 2011/0129641 A1 | 6/2011 | Kimura et al. | |
| 2012/0237728 A1 | 9/2012 | Kimura et al. | |
| 2015/0302958 A1 | 10/2015 | Sadai et al. | |
| 2016/0284453 A1 | 9/2016 | Okano et al. | |
| 2017/0117075 A1* | 4/2017 | Okano | H05K 9/00 |

FOREIGN PATENT DOCUMENTS

| | | |
|---|---|---|
| EP | 1 968 079 | 9/2008 |
| EP | 2 916 330 | 9/2015 |
| EP | 3 064 481 | 9/2016 |
| JP | 6-309085 | 4/1994 |
| JP | 6-149450 | 5/1994 |

(Continued)

OTHER PUBLICATIONS

Extended European Search Report issued in Appln. No. 15796179.8 dated Jan. 3, 2018.
International Preliminary Report on Patentability issued in PCT/JP2015/064593 dated Nov. 22, 2016.
International Search Report for PCT/JP2015/064593 dated Jun. 23, 2015, 2 pages.
Ito, "Basics of Ferrite and Noise Countermeasures" *TDK EMC Technology*, 9 pages, accessed 2019.

*Primary Examiner* — Megha M Gaitonde
(74) *Attorney, Agent, or Firm* — Nixon & Vanderhye P.C.

(57) ABSTRACT

The present invention relates to a ferrite sintered plate having a composition comprising 47 to 50 mol % of $Fe_2O_3$, 7 to 26 mol % of NiO, 13 to 36 mol % of ZnO, 7 to 12 mol % of CuO and 0 to 1.5 mol % of CoO, as calculated in terms of the respective oxides, in which the ferrite sintered plate has a volume resistivity of $1 \times 10^8$ to $1 \times 10^{12}$·cm and a thickness of 10 to 60 μm; and a ferrite sintered sheet comprising the ferrite sintered plate on a surface of which a groove or grooves are formed, and an adhesive layer and/or a protective layer formed on the ferrite sintered plate, in which the ferrite sintered sheet has a magnetic permeability at 500 kHz a real part of which is 120 to 800 and an imaginary part of which is 0 to 30, and a product (μm) of the real part of the magnetic permeability at 500 kHz of the ferrite sintered sheet and a thickness of the ferrite sintered plate is 5000 to 48000. The ferrite sintered plate and the ferrite sintered sheet according to the present invention have a high volume resistivity as well as a large μ' value and a small μ" value of a magnetic permeability thereof, and therefore can be suitably used as a shielding plate in a digitizer system.

11 Claims, No Drawings

(56) References Cited

FOREIGN PATENT DOCUMENTS

| JP | 8-221176 | 8/1996 |
| JP | 2002-141215 | 5/2002 |
| JP | 2005-132715 | 5/2005 |
| WO | WO 2014/069440 | 5/2014 |
| WO | WO 2015/064693 | 5/2015 |

* cited by examiner

FERRITE SINTERED PLATE AND FERRITE SINTERED SHEET

This application is the U.S. national phase of International Application No. PCT/JP2015/064593 filed May 21, 2015 which designated the U.S. and claims priority to JP Patent Application No. 2014-106298 filed May 22, 2014, the entire contents of each of which are hereby incorporated by reference.

TECHNICAL FIELD

The present invention provides a ferrite sintered plate, and a ferrite sintered sheet comprising the ferrite sintered plate and an adhesive layer and/or a protective layer formed on a surface of the ferrite sintered plate. More particularly, the present invention provides a shielding plate disposed on a backside surface of a detector in a digitizer system of a mobile terminal.

BACKGROUND ART

A mobile terminal such as a smartphone, a tablet terminal and a personal computer is mounted with a digitizer system for detecting positional information on a liquid crystal display as digital information which is inputted by a coordinate indicator such as a touch pen. In this system, the positional information is detected by means of magnetic coupling between the coordinate indicator and the detector using an A.C. magnetic field of about 100 kHz to about 1 MHz. For the purpose of enhancing read sensitivity or positional accuracy in the digitizer system, a shielding plate is disposed on a backside surface of the detector to thereby suppress adverse influence of unnecessary magnetic field from outside.

In order to enhance the read sensitivity or positional accuracy in the digitizer system and meet requirements of the market, such as reduction in weight and thickness of the device, there are disclosed the technology in which a ferrite plate or a sheet-like parts formed by dispersing ferrite particles in a rubber or plastic material is used as a shielding plate (Patent Literature 1), the technology using a magnetic thin plate formed of permalloy or amorphous metal (Patent Literature 2), and the technology using ferrite, a ferrite-containing body, an iron carbonyl compacted body, a permalloy compacted body and a sendust compacted body (Patent Literature 3).

CITATION LIST

Patent Literatures

Patent Literature 1: Japanese Patent Application Laid-Open (KOKAI) No. 6-149450
Patent Literature 2: Japanese Patent Application Laid-Open (KOKAI) No. 6-309085
Patent Literature 3: Japanese Patent Application Laid-Open (KOKAI) No. 8-221176

SUMMARY OF INVENTION

Technical Problem

In order to enhance the read sensitivity or positional accuracy of the mobile terminal, it is required that the shielding material is increased in electric resistivity to suppress generation of eddy current therein, or the shield plate is increased in a real part ($\mu'$) of a magnetic permeability thereof. In addition, in order to obtain the system having a high efficiency, it is required that the shield plate is decreased in an imaginary part ($\mu''$) of a magnetic permeability thereof to thereby reduce loss of a detection circuit used therein.

Moreover, in order to reduce a weight and a thickness of the mobile terminal, it is required that the thickness of the shielding material is adjusted to about several tens μm.

In the case where the thickness of the shielding material is reduced to such a small range, it is necessary to take the relationship between $\mu'$ and the thickness of the shielding material into consideration. The inductance of a loop antenna used for detecting a magnetic field may vary depending upon $\mu'$ and the thickness of the shielding plate, and as $\mu'$ is increased and also as the thickness of the shielding plate is increased, the inductance of the loop antenna is increased. More specifically, as a product of $\mu'$ and the thickness of the shielding plate is increased, the read sensitivity or positional accuracy of positional information can be enhanced to a higher extent. For this reason, in the case where the thickness of the shielding material is reduced, it is necessary to control not only $\mu'$ and the thickness of the shielding plate but also a product of $\mu'$ and the thickness of the shielding plate to respective adequate ranges.

In Patent Literature 1, there is described the technology of using a ferrite plate as the shielding plate disposed on a backside surface of the detector. However, in Patent Literature 1, it is not taken into consideration to control the thickness of the ferrite plate to a reduced value. In addition, in Patent Literature 1, there is also described the technology of using a sheet-like parts prepared by dispersing ferrite particles in a rubber or a plastic material. Although ferrite in the form of a bulk has a high $\mu'$ value, the upper limit of $\mu'$ of a sheet formed by dispersing particles of the ferrite in a resin, etc., is as low as about 20, since the non-magnetic resin is present between the particles. Therefore, in order to enhance the read sensitivity or positional accuracy for the mobile terminal, it is necessary to control $\mu'$ to a still higher value.

In Patent Literature 2, there is described the technology of using the magnetic thin plate formed of permalloy or amorphous metal as the shielding plate. By referring to Examples of Patent Literature 2, as the frequency is increased, the effective magnetic permeability of the magnetic thin plate is reduced, and it is therefore recognized that the magnetic loss ($\mu''$) owing to eddy current generated in the shielding plate tends to be increased. For this reason, the loss of the detection circuit as a whole tends to become large. Thus, the technology described in Patent Literature 2 fails to provide an efficiently operable system.

In Patent Literature 3, there is described the technology of using an iron carbonyl compacted body, a permalloy compacted body and a sendust compacted body as the shielding plate. However, the upper limit of $\mu'$ of these compacted bodies is about 50 owing to the presence of gaps between the magnetic particles. Therefore, in order to enhance the read sensitivity or positional accuracy in the digitizer system, it is required that the $\mu'$ value of the shielding plate is controlled to a still higher value.

In consequence, an object or a technical task of the present invention is to provide a ferrite sintered plate and a ferrite sintered sheet which have a high electric resistivity and a magnetic permeability having a large real part ($\mu'$) and a small imaginary part ($\mu''$), for the purpose of realizing a sufficient read sensitivity or positional accuracy in a digitizer system.

Solution to Problem

The above object or technical task of the present invention can be achieved by the following aspects of the present invention.

That is, according to the present invention, there is provided a ferrite sintered plate which has a composition comprising 47 to 50 mol % of $Fe_2O_3$, 7.0 to 26 mol % of NiO, 13 to 36 mol % of ZnO, 7.0 to 12 mol % of CuO and 0 to 1.5 mol % of CoO, as calculated in terms of the respective oxides, which has a volume resistivity of $1\times10^8$ to $1\times10^{12}\cdot cm$ and which has a thickness of 10 to 60 μm (Invention 1).

Also, according to the present invention, there is provided the ferrite sintered plate as defined in the above Invention 1, wherein the ferrite sintered plate has a magnetic permeability at 500 kHz a real part of which is 160 to 1200 and an imaginary part of which is 0 to 90 (Invention 2).

Also, according to the present invention, there is provided the ferrite sintered plate as defined in the above Invention 1 or 2, wherein a product of the real part of the magnetic permeability at 500 kHz of the ferrite sintered plate and a thickness of the ferrite sintered plate is 7500 to 72000 (Invention 3).

Also, according to the present invention, there is provided the ferrite sintered plate as defined in any one of the above Inventions 1 to 3, wherein at least one groove is formed on at least one surface of the ferrite sintered plate (Invention 4).

Further, according to the present invention, there is provided a ferrite sintered sheet comprising the ferrite sintered plate according to any one of the above Inventions 1 to 4, and an adhesive layer or a protective layer which is formed on at least one surface of the ferrite sintered plate (Invention 5).

Furthermore, according to the present invention, there is provided a ferrite sintered sheet comprising the ferrite sintered plate according to any one of the above Inventions 1 to 4, an adhesive layer formed on one surface of the ferrite sintered plate, and a protective layer formed on the other surface of the ferrite sintered plate (Invention 6).

Furthermore, according to the present invention, there is provided a ferrite sintered sheet comprising the ferrite sintered plate according to any one of the above Inventions 1 to 4, and adhesive layers respectively formed on opposite surfaces of the ferrite sintered plate (Invention 7).

Furthermore, according to the present invention, there is provided a ferrite sintered sheet comprising the ferrite sintered plate according to any one of the above Inventions 1 to 4, and protective layers respectively formed on opposite surfaces of the ferrite sintered plate (Invention 8).

Also, according to the present invention, there is provided the ferrite sintered sheet as defined in any one of the above Inventions 5 to 8, wherein the ferrite sintered plate is partitioned into small pieces (Invention 9).

Also, according to the present invention, there is provided the ferrite sintered sheet as defined in the above Invention 9, wherein the ferrite sintered sheet has a magnetic permeability at 500 kHz a real part of which is 120 to 800 and an imaginary part of which is 0 to 30, and a product of the real part of the magnetic permeability at 500 kHz and a thickness of the ferrite sintered plate is 5000 to 48000 (Invention 10).

Furthermore, according to the present invention, there is provided a ferrite sintered plate having a volume resistivity of $1\times10^8$ to $1\times10^{12}\cdot cm$, a thickness of 10 to 60 μm and a magnetic permeability at 500 kHz a real part of which is 160 to 1200 and an imaginary part of which is 0 to 90 (Invention 11).

Furthermore, according to the present invention, there is provided a ferrite sintered sheet comprising a ferrite sintered plate having a volume resistivity of $1\times10^8$ to $1\times10^{12}\cdot cm$, and an adhesive layer or a protective layer which is formed on at least one surface of the ferrite sintered plate, in which the ferrite sintered plate is partitioned into small pieces, and the ferrite sintered sheet has a magnetic permeability at 500 kHz a real part of which is 120 to 800 and an imaginary part of which is 0 to 30 (Invention 12).

Furthermore, according to the present invention, there is provided a digitizer system comprising a detector and a shielding plate disposed adjacent to the detector, in which the shielding plate is constituted of the ferrite sintered plate as defined in any one of the above Inventions 1 to 4 and 11 (Invention 13).

In addition, according to the present invention, there is provided a digitizer system comprising a detector and a shielding plate disposed adjacent to the detector, in which the shielding plate is constituted of the ferrite sintered sheet as defined in any one of the above Inventions 5 to 10 and 12 (Invention 14).

Advantageous Effects of Invention

The ferrite sintered plate and the ferrite sintered sheet according to the present invention has a high electric resistivity and a magnetic permeability having a large real part (μ') and a small imaginary part (μ"), and therefore can be suitably used as a shielding plate for improving read sensitivity or positional accuracy in a digitizer system

DESCRIPTION OF EMBODIMENTS

The construction of the present invention is described in detail below.

The ferrite sintered plate according to the present invention has a volume resistivity of $1\times10^8$ to $1\times10^{12}\cdot cm$. When the volume resistivity of the ferrite sintered plate is less than $1\times10^8\cdot cm$, the loss of the resulting digitizer system tends to be increased owing to generation of eddy current therein. The upper limit of the volume resistivity of the ferrite sintered plate is $1\times10^{12}\cdot cm$ in view of the properties inherent to the material according to the present invention. The volume resistivity of the ferrite sintered plate is preferably $2\times10^8$ to $1\times10^{12}\cdot cm$.

The ferrite sintered plate according to the present invention has a composition comprising 47 to 50 mol % of $Fe_2O_3$, 7 to 26 mol % of NiO, 13 to 36 mol % of ZnO, 7 to 12 mol % of CuO and 0 to 1.5 mol % of CoO, as calculated in terms of the respective oxides, with the proviso that a total molar amount of the above oxides is 100 mol %. However, the ferrite sintered plate may also comprise a very small amount of impurities that may be inevitably mixed in the ferrite sintered plate from the raw materials or during the production process.

When the content of $Fe_2O_3$ in the ferrite sintered plate according to the present invention is less than 47 mol %, the μ' value of the ferrite sintered plate tends to be decreased. When the content of $Fe_2O_3$ in the ferrite sintered plate according to the present invention is more than 50 mol %, it is not possible to sinter the ferrite composition at a low temperature. The content of $Fe_2O_3$ in the ferrite sintered plate according to the present invention is preferably 47 to 49.5 mol %.

When the content of NiO in the ferrite sintered plate according to the present invention is less than 7 mol %, the μ" value of the ferrite sintered plate tends to be increased.

When the content of NiO in the ferrite sintered plate according to the present invention is more than 26 mol %, the $\mu'$ value of the ferrite sintered plate tends to be decreased. The content of NiO in the ferrite sintered plate according to the present invention is preferably 7.5 to 26.0 mol %.

When the content of ZnO in the ferrite sintered plate according to the present invention is less than 13 mol %, the $\mu'$ value of the ferrite sintered plate tends to be decreased. When the content of ZnO in the ferrite sintered plate according to the present invention is more than 36 mol %, the $\mu''$ value of the ferrite sintered plate tends to be increased. The content of ZnO in the ferrite sintered plate according to the present invention is preferably 14.0 to 35.5 mol %.

When the content of CuO in the ferrite sintered plate according to the present invention is less than 7 mol %, it is not possible to sinter such a ferrite composition. When the content of CuO in the ferrite sintered plate according to the present invention is more than 12 mol %, the $\mu'$ value of the ferrite sintered plate tends to be decreased, and the volume resistivity of the ferrite sintered plate tends to be reduced to less than $1\times10^8 \cdot cm$ so that the eddy current loss of the ferrite sintered plate tends to be increased, and further the read sensitivity or positional accuracy of positional information tend to be deteriorated and the loss of the detection circuit as a whole tends to be increased. The content of CuO in the ferrite sintered plate according to the present invention is preferably 7.5 to 11.5 mol %.

The ferrite sintered plate according to the present invention may comprise CoO in the case where it is required to further reduce the $\mu''$ value of the ferrite sintered plate. When the content of CoO in the ferrite sintered plate according to the present invention is more than 1.5 mol %, the temperature-dependent change of the $\mu'$ value of the ferrite sintered plate tends to be undesirably increased.

The thickness of the ferrite sintered plate according to the present invention is preferably 10 to 60 μm. The ferrite sintered plate having a thickness of less than 10 μm will be difficult to industrially produce. When the thickness of the ferrite sintered plate is more than 60 μm, such a ferrite sintered plate tends to fail to meet the requirement of reduction in thickness thereof, and further tends to suffer from increase in weight and therefore also tends to fail to meet the requirement of reduction in weight thereof.

The real part $\mu'$ of the magnetic permeability at 500 kHz of the ferrite sintered plate according to the present invention is preferably 160 to 1200. When the real part $\mu'$ of the magnetic permeability at 500 kHz of the ferrite sintered plate is less than 160, the read sensitivity or positional accuracy of positional information tend to be lowered. When the real part $\mu'$ of the magnetic permeability at 500 kHz of the ferrite sintered plate is more than 1200, the imaginary part $\mu''$ of the magnetic permeability tends to be increased, so that the loss of digitizer system tends to be increased. The real part $\mu'$ of the magnetic permeability at 500 kHz of the ferrite sintered plate according to the present invention is more preferably 170 to 1200. When subjecting the ferrite sintered plate to partitioning treatment that may be conducted according to requirements, the real part $\mu'$ of the magnetic permeability is reduced to about 50% to about 80% of the real part $\mu'$ before the treatment. Therefore, assuming that the real part $\mu'$ of the magnetic permeability at 500 kHz of the ferrite sintered plate or the ferrite sintered sheet subjected to no partitioning treatment lies within the range of 160 to 1200, it is possible to obtain the ferrite sintered sheet subjected to the partitioning treatment which has a magnetic permeability a real part $\mu'$ of which is in the range of 120 to 800.

The imaginary part $\mu''$ of the magnetic permeability at 500 kHz of the ferrite sintered plate according to the present invention is preferably 0 to 90. The lower limit of the imaginary part $\mu''$ of the magnetic permeability at 500 kHz of the ferrite sintered plate is 0 in view of the properties inherent to the material according to the present invention. When the imaginary part $\mu''$ of the magnetic permeability at 500 kHz of the ferrite sintered plate is more than 90, the loss of the digitizer system tends to be increased. The imaginary part $\mu''$ of the magnetic permeability at 500 kHz of the ferrite sintered plate according to the present invention is more preferably 0 to 80. When subjecting the ferrite sintered plate to partitioning treatment that may be conducted according to requirements, the imaginary part $\mu''$ of the magnetic permeability is reduced as compared to that before the treatment. Therefore, assuming that the imaginary part $\mu''$ of the magnetic permeability at 500 kHz of the ferrite sintered plate or the ferrite sintered sheet subjected to no partitioning treatment lies within the range of 0 to 90, it is possible to obtain the ferrite sintered sheet subjected to the partitioning treatment which has such a magnetic permeability an imaginary part $\mu''$ of which is in the range of 0 to 30.

In the ferrite sintered plate according to the present invention, the product (μm) of the real part $\mu'$ of the magnetic permeability at 500 kHz of the ferrite sintered plate and the thickness (μm) of the ferrite sintered plate is preferably 7500 to 72000. When the aforementioned product is less than 7500, the read sensitivity or positional accuracy of positional information tend to be deteriorated. The upper limit of product of the real part of the magnetic permeability and the thickness of the ferrite sintered plate according to the present invention is 72000 as determined from the upper limit of the real part of the magnetic permeability and the upper limit of the thickness of the ferrite sintered plate. Since the real part $\mu'$ of the magnetic permeability is decreased by the partitioning treatment, assuming that the product of the real part of the magnetic permeability of the ferrite sintered plate or the ferrite sintered sheet subjected to no partitioning treatment and the thickness of the ferrite sintered plate is in the range of 7500 to 72000, it is possible to obtain a ferrite sintered sheet subjected to the partitioning treatment in which a product of the real part of the magnetic permeability thereof and the thickness of the ferrite sintered plate lies within the range of 5000 to 48000.

Next, the ferrite sintered sheet according to the present invention is described.

The ferrite sintered sheet according to the present invention comprises the aforementioned ferrite sintered plate, and an adhesive layer or a protective layer which is formed on at least one surface of the ferrite sintered plate.

The adhesive layer used in the present invention may be formed of a double-sided adhesive tape. The double-sided adhesive tape is not particularly limited, and any known double-sided adhesive tape using a PET film or a polyimide film as a base material or comprising no base material may be used in the present invention. In addition, the adhesive layer may be provided in the form of a laminated film obtained by sequentially laminating an adhesive, a bendable and stretchable film such as a PET film or a polyimide film, an adhesive and a release film on one surface of the ferrite sintered plate. The thickness of the adhesive layer is preferably 3 to 10 μm in view of the requirement of reduction in thickness of the shielding material.

The provision of the protective layer used in the present invention is capable of enhancing reliability and durability against dusting caused upon partitioning the ferrite sintered plate into parts. The protective layer is not particularly limited as long as the protective layer is formed of a resin that can be stretched without breakage when bending the ferrite sintered sheet. Examples of the protective layer include a PET film, a polyimide film, a resin-containing paint and the like. In addition, the protective film may be provided in the form of a laminated film obtained by sequentially laminating an adhesive and a bendable and stretchable film such as a PET film or a polyimide film on one surface of the ferrite sintered plate. Furthermore, two or more protective layers may be provided on the ferrite sintered plate, and in the case where an upper one of the protective layers suffers from flaws, stains, break or the like upon the production steps and processing steps of the ferrite sintered sheet, the protective layers are sequentially peeled off to thereby finally obtain a ferrite sintered sheet having a clean protective layer that is free of flaws, stains, break or the like as an uppermost layer. The thickness of the protective layer is preferably 3 to 10 μm in view of the requirement of reduction in thickness of the shielding material.

In the ferrite sintered sheet subjected to no partitioning treatment according to the present invention, the real part $\mu'$ and the imaginary part $\mu''$ of the magnetic permeability at 500 kHz thereof as well as the product (μm) of the real part $\mu'$ of the magnetic permeability and the thickness (μm) of the ferrite sintered plate are respectively the same as those described above with respect to the ferrite sintered plate according to the present invention.

In order to closely attach the ferrite sintered sheet to a bent portion, the ferrite sintered sheet according to the present invention may have such a structure that the ferrite sintered plate used therein can be partitioned into parts along at least one groove as a starting point for the partitioning operation which is previously formed on at least one surface of the ferrite sintered plate. The groove may be formed either continuously or intermittently. In addition, a number of fine recesses may be substituted for the groove. The shape of a section of the groove is not particularly limited, and the groove may desirably have a U-shaped section or a V-shaped section.

In the ferrite sintered sheet according to the present invention, in order to closely attach the ferrite sintered sheet to a bent portion and prevent the sheet from breaking upon use, the ferrite sintered plate used therein is preferably previously partitioned into small pieces. For example, there may be used any of the method in which the ferrite sintered plate is partitioned into parts along at least one groove as a starting point for the partitioning operation which is previously formed on at least one surface of the ferrite sintered plate, and the method in which the ferrite sintered plate is partitioned into small pieces without forming any groove.

The ferrite sintered plate may be partitioned by the groove into parts having an optional size which may be of a triangular shape, a quadrilateral shape, a polygonal shape or a combination of any two or more of these shapes. For example, the length of one side of the triangular shape, quadrilateral shape or polygonal shape is usually 1 to 12 mm. When a member to which the ferrite sintered sheet is to be attached has a curved surface, the length of one side of the triangular shape, quadrilateral shape or polygonal shape is preferably not less than 1 mm and not more than ⅓ of a radius of curvature of the member, and more preferably not less than 1 mm and not more than ¼ of a radius of curvature of the member. Furthermore, the ferrite sintered plate may be partitioned not by the groove but by any other means into any amorphous shapes.

The width of an upper open portion of the groove formed on the ferrite sintered plate is usually preferably not more than 250 μm, and more preferably 1 to 150 μm. When the width of an upper open portion of the groove is more than 250 μm, the ferrite sintered plate tends to suffer from undesirably large deterioration in magnetic permeability. In addition, the depth of the groove is preferably 1/20 to ¼ and more preferably 1/20 to ⅙ of the thickness of the ferrite sintered plate.

The real part $\mu'$ of the magnetic permeability at 500 kHz of the ferrite sintered sheet subjected to the partitioning treatment according to the present invention is preferably 120 to 800. When the real part $\mu'$ of the magnetic permeability is less than 120, the read sensitivity or positional accuracy of positional information tend to be lowered. When the real part $\mu'$ of the magnetic permeability is more than 800, the imaginary part $\mu''$ of the magnetic permeability tends to be increased, so that the loss of the resulting digitizer system tends to be increased. The real part $\mu'$ of the magnetic permeability at 500 kHz of the ferrite sintered sheet subjected to the partitioning treatment according to the present invention is more preferably 150 to 700.

The imaginary part $\mu''$ of the magnetic permeability at 500 kHz of the ferrite sintered sheet subjected to the partitioning treatment according to the present invention is preferably 0 to 30. The lower limit of the imaginary part $\mu''$ of the magnetic permeability of the ferrite sintered sheet is 0 in view of the properties inherent to the material according to the present invention. When the imaginary part $\mu''$ of the magnetic permeability is more than 30, the loss of the resulting digitizer system tends to be increased. The imaginary part $\mu''$ of the magnetic permeability at 500 kHz of the ferrite sintered sheet subjected to the partitioning treatment according to the present invention is more preferably 0 to 25.

In the ferrite sintered sheet subjected to the partitioning treatment according to the present invention, the product (μm) of the real part $\mu'$ of the magnetic permeability of the ferrite sintered sheet and the thickness (μm) of the ferrite sintered plate is preferably 5000 to 48000. When the aforementioned product is less than 5000, the read sensitivity or positional accuracy of positional information tend to be deteriorated. The upper limit of product of the real part of the magnetic permeability and the thickness of the ferrite sintered plate according to the present invention is 48000 as determined from the upper limit of the real part of the magnetic permeability and the upper limit of the thickness of the ferrite sintered plate.

Next, the processes for producing the ferrite sintered plate and the ferrite sintered sheet according to the present invention are described.

First, the ferrite particles may be produced by pre-calcining a raw material mixture prepared by mixing raw materials such as oxides, carbonates, hydroxides, oxalates, etc., of the respective elements as constituents of the ferrite at a predetermined compositional ratio, or by pre-calcining a precipitated product prepared by precipitating the respective elements in an aqueous solution thereof, in atmospheric air in a temperature range of 700 to 900° C. for 1 to 20 hr, and then pulverizing the resulting pre-calcined product.

The resulting ferrite particles are mixed with a binder resin, and the resulting mixture is molded into a ferrite plate by a powder compression molding method, an injection molding method, a calendering method, an extrusion method, etc., and the resulting ferrite plate is subjected to sintering treatment, if required, after being subjected to degreasing treatment, whereby it is possible to obtain the ferrite sintered plate. Alternatively, the ferrite particles, a binder resin and a solvent are mixed with each other, and the resulting mixture is applied onto a film or a sheet using a doctor blade, etc., to obtain a green sheet, and the resulting green sheet is subjected to sintering treatment, if required, after being subjected to degreasing treatment, whereby it is possible to obtain the ferrite sintered plate. Incidentally, a plurality of the obtained green sheets may be laminated on each other, and then the resulting laminate may be sintered.

In the case where the groove is formed on the ferrite sintered plate according to the requirements, formation of the groove may be conducted during or after the molding step of the ferrite plate or after the sintering treatment. For example, when forming the ferrite plate by a powder compression molding method or an injection molding method, it is preferred to form the groove during the molding step, whereas when forming the ferrite plate by a calendering method or an extrusion method, it is preferred to form the groove after the molding step but before the sintering treatment. In the case where the ferrite sintered plate is produced through the green sheet, it is preferred to form the groove on the green sheet.

The degreasing treatment is usually carried out at a temperature of 150 to 500° C. The sintering temperature is usually 850 to 970° C., and preferably 870 to 960° C. The sintering time is usually 30 to 180 min, and preferably 30 to 120 min. When the sintering temperature is lower than 850° C., it may be difficult to sinter the particles, so that the resulting ferrite sintered plate tends to be insufficient in strength, and the $\mu'$ value thereof tends to be lowered. In addition, since the sintering temperature of 970° C. is sufficient to allow sintering of the particles to well proceed, it is not necessary to raise the sintering temperature to higher than 970° C. When the sintering time is less than 30 min, it may be difficult to sinter the particles, so that the resulting ferrite sintered plate tends to be insufficient in strength, and the $\mu'$ value thereof tends to be lowered. In addition, since the sintering time of 180 min is sufficient to allow the sintering of the particles to well proceed, it is not necessary to prolong the sintering time over 180 min.

Next, an adhesive layer may be provided on a surface of the resulting ferrite sintered plate, for example, by attaching a double-sided adhesive tape thereonto, to thereby obtain the ferrite sintered sheet. The adhesive layer may be formed on one surface or opposite surfaces of the ferrite sintered plate.

In addition, a protective layer may be provided on a surface of the resulting ferrite sintered plate to thereby obtain the ferrite sintered sheet. The protective layer may be formed on one surface or opposite surfaces of the ferrite sintered plate. The protective layer may be formed by bonding a film or a sheet of a resin constituting the protective layer onto the surface of the ferrite sintered plate, if required, through an adhesive, or by applying a coating material comprising a resin constituting the protective layer onto the surface of the ferrite sintered plate. When forming the protective layer on the surface of the ferrite sintered plate, it is possible to prevent occurrence of dusting from the ferrite sintered plate.

Also, according to the present invention, the adhesive layer may be formed on one surface of the ferrite sintered plate, and the protective layer may be formed on the other surface of the ferrite sintered plate to thereby obtain the ferrite sintered sheet.

In the case of producing the ferrite sintered sheet subjected to the partitioning treatment, after forming the adhesive layer and/or the protective layer on the ferrite sintered plate, the resulting ferrite sintered sheet may be partitioned into parts using a roller or the like.

The digitizer system according to the present invention comprises a detector and a shielding plate disposed on a backside surface of the detector which is constituted of the ferrite sintered plate or the ferrite sintered sheet according to the present invention. Actually, the digitizer system is further combined with a coordinate indicator to allow the system to exhibit its function. The shielding plate may be disposed in direct contact with the backside surface of the detector. Alternatively, the shielding plate may be disposed spaced apart from the backside surface of the detector with a gap therebetween or may be disposed through the other layer on the backside surface of the detector, unless these arrangements have adverse influence on reduction in size of the system.

<Function>

The most important point of the present invention resides in such a fact that the ferrite sintered plate or the ferrite sintered sheet according to the present invention has a high volume resistivity and therefore suffers from less eddy current loss, and also exhibits a magnetic permeability having a large real part $\mu'$ and a small imaginary part $\mu''$ as a magnetic loss thereof, and furthermore a product of the real part $\mu'$ of the magnetic permeability and the thickness of the ferrite sintered plate lies within an adequate range. For this reason, when the ferrite sintered plate or the ferrite sintered sheet according to the present invention is used as a shielding plate for a digitizer system, it is possible to enhance read sensitivity or positional accuracy in the digitizer system and minimize the loss of a detection circuit as a whole.

EXAMPLES

Typical embodiments of the present invention are as follows.

The composition of the ferrite sintered plate was measured using a fluorescent X-ray analyzer "3530" manufactured by Rigaku Corporation.

The density of the ferrite sintered plate was calculated from an outer dimension and a weight of the ferrite sintered plate measured using calipers and a micrometer.

The thickness of each of the ferrite sintered plate and the ferrite sintered sheet was measured using a micrometer.

The $\mu'$ value and the $\mu''$ value of the ferrite sintered sheet subjected to partitioning treatment were measured as follows. That is, both the values of a ring member formed by punching the ferrite sintered sheet into a ring shape having an outer diameter of 20 mm and an inner diameter of 10 mm were measured at a frequency of 500 kHz using an impedance analyzer "4294A" manufactured by Agilent Technologies.

The $\mu'$ value and the $\mu''$ value of the ferrite sintered plate or the ferrite sintered sheet subjected to no partitioning treatment were measured as follows. That is, the ferrite sintered plate or the ferrite sintered sheet was cut into a ring shape having an outer diameter of 20 mm and an inner diameter of 10 mm by an ultrasonic processor to obtain a ring member, and both the $\mu'$ and $\mu''$ values of the thus obtained ring member were measured at a frequency of 500 kHz using an impedance analyzer "4294A" manufactured by Agilent Technologies.

The volume resistivity of the ferrite sintered plate was measured using any of a high resistance meter "4339B" manufactured by Agilent Technologies and a resistance meter "3541" manufactured by Hioki E. E. Corp., according to the magnitude of the resistivity to be measured.

Example 1

The respective raw material oxides were weighed such that a ferrite material obtained therefrom had a predetermined composition, and wet-mixed with each other for 20 hr using a ball mill. Thereafter, the resulting mixed slurry was subjected to filtration and then drying to obtain mixed particles as a raw material. The thus obtained mixed particles were calcined at 730° C. for 2 hr, and the resulting pre-calcined product was pulverized using a ball mill, thereby obtaining Ni—Zn—Cu ferrite particles according to the present invention.

Eight parts by weight of polyvinyl butyral as a binder material, 3 parts by weight of benzyl-n-butyl phthalate as a plasticizer and 50 parts by weight of 3-methyl-3-methoxy-1-butanol as a solvent were added to 100 parts by weight of the thus obtained Ni—Zn—Cu ferrite particles, and then the resulting mixture was fully mixed to obtain a slurry. The thus obtained slurry was applied onto a PET film using a doctor blade-type coater to form a coating film thereon. The coating film was then dried to obtain a green sheet having a thickness of 43 μm. Using a blade mold, grid-like grooves were formed on one surface of the green sheet.

The resulting green sheet was degreased at 400° C., and then sintered at 960° C. for 2 hr, thereby obtaining a ferrite sintered plate. The thus obtained ferrite sintered plate had a composition comprising 47.1 mol % of $Fe_2O_3$, 9.9 mol % of NiO, 33.8 mol % of ZnO and 9.2 mol % of CuO, a volume resistivity of $3 \times 10^{11}$·cm, a thickness of 35 μm, a density of 5.23 g/cm$^3$, μ' of 849 and μ" of 34. In addition, the product (μm) of the real part μ' of the permeability and the thickness of the ferrite sintered plate was 29722.

A PET film having a thickness of 5 μm was attached onto one surface of the resulting ferrite sintered plate, and a double-sided tape having a thickness of 5 μm was attached onto the other surface of the ferrite sintered plate, thereby obtaining a ferrite sintered sheet having a thickness of 45 μm.

The resulting ferrite sintered sheet was partitioned into small pieces using a roller, and the ferrite sintered sheet after being subjected to the partitioning treatment had μ' of 535 and μ" of 7. In addition, the product (μm) of the real part μ' of the magnetic permeability and the thickness of the ferrite sintered plate was 18725.

Examples 2 to 4

Respective ferrite sintered plates and ferrite sintered sheets were produced by the same method as in Example 1. The production conditions used in the Examples and various properties of the thus obtained ferrite sintered plates and ferrite sintered sheets are shown in Table 1.

Comparative Example 1

The respective raw material oxides were weighed such that ferrite obtained therefrom had a predetermined composition, and wet-mixed with each other for 20 hr using a ball mill. Thereafter, the resulting mixed slurry was subjected to filtration and drying to obtain mixed particles as a raw material. The thus obtained mixed particles were calcined at 1000° C. for 2 hr, and the resulting pre-calcined product was pulverized using a dry-type vibration mill, thereby obtaining Ni—Zn—Cu ferrite particles. The thus obtained Ni—Zn—Cu ferrite particles had a composition comprising 49.5 mol % of $Fe_2O_3$, 8.3 mol % of NiO, 35.0 mol % of ZnO and 7.2 mol % of CuO. The resulting Ni—Zn—Cu ferrite particles were mixed with an ethylene-vinyl acetate copolymer such that the proportion of the Ni—Zn—Cu ferrite particles in the obtained mixture was 60 vol %, and the resulting mixture was kneaded at 80° C. using a plastomill. The thus obtained kneaded material was formed into a sheet having a thickness of 50 μm at 60° C. using a twin hot roll press. The thus obtained sheet had a volume resistivity of $7 \times 10^{10}$·cm, and μ' of 16 and μ" of 0 as measured at 500 kHz. In addition, the product (μm) of μ' and the thickness of the sheet was 800.

Comparative Example 2

Flat iron-aluminum-silicon alloy particles (weight ratio of iron/aluminum/silicon: 85:6:9; aspect ratio: 20 to 30; average particle diameter: 40 μm) were fully mixed in a solution prepared by dissolving 20% by weight of a styrene-based elastomer in cyclohexanone, in amounts calculated such that volume ratios of the alloy particles and the styrene-based elastomer after removing the solvent from the resulting mixture were 55% by volume and 45% by volume, respectively, thereby obtaining a slurry. At that time, ethyl cyclohexanone was added to the slurry in order to suitably control a viscosity of the slurry. The thus obtained slurry was applied onto a PET film using a doctor blade-type coater, and then dried. The resulting coated film was press-molded at a temperature of 130° C. and a pressure of 90 MPa for 5 min, thereby obtaining a sheet comprising the flat iron-aluminum-silicon alloy particles and having a thickness of 60 μm. The resulting sheet had a volume resistivity of $3 \times 10^5$·cm, and μ' of 110 and μ" of 0 as measured at 500 kHz. In addition, the product (μm) of μ' and the thickness of the sheet was 6600.

Comparative Example 3

A ferrite sintered plate and a ferrite sintered sheet were produced by the same method as in Example 1. The production conditions used in Comparative Example 3 and various properties of the thus obtained ferrite sintered plate and ferrite sintered sheet are shown in Table 1.

TABLE 1

| No. | $Fe_2O_3$ [mol %] | NiO [mol %] | ZnO [mol %] | CuO [mol %] | CoO [mol %] |
| --- | --- | --- | --- | --- | --- |
| Example 1 | 47.1 | 9.9 | 33.8 | 9.2 | 0.0 |
| Example 2 | 49.9 | 7.8 | 35.2 | 7.1 | 0.0 |
| Example 3 | 49.2 | 15.1 | 23.9 | 11.8 | 0.0 |
| Example 4 | 48.8 | 25.8 | 14.0 | 11.4 | 0.0 |
| Example 5 | 48.4 | 11.4 | 28.0 | 10.9 | 1.3 |
| Comp. Example 1 | 49.5 | 8.3 | 35.0 | 7.2 | 0.0 |
| Comp. Example 2 | — | — | — | — | — |
| Comp. Example 3 | 51.8 | 12.7 | 31.2 | 4.3 | 0.0 |

| No. | Sintering temperature [° C.] | Sintered density [g/cc] | Thickness [μm] | Volume resistivity [·cm] |
| --- | --- | --- | --- | --- |
| Example 1 | 960 | 5.23 | 35 | $3 \times 10^{11}$ |
| Example 2 | 920 | 5.16 | 15 | $3 \times 10^8$ |
| Example 3 | 880 | 5.13 | 60 | $2 \times 10^8$ |
| Example 4 | 860 | 5.08 | 50 | $4 \times 10^9$ |
| Example 5 | 905 | 5.15 | 45 | $8 \times 10^{10}$ |
| Comp. Example 1 | — | — | 50 | $7 \times 10^{10}$ |
| Comp. Example 2 | — | — | 60 | $3 \times 10^5$ |
| Comp. Example 3 | 1150 | 5.16 | 53 | $5 \times 10^3$ |

TABLE 1-continued

| | Before partitioning | | | After partitioning | | |
|---|---|---|---|---|---|---|
| No. | µ' at 500 kHz | µ" | µ' × thickness [µm] | µ' at 500 kHz | µ" | µ' × thickness [µm] |
| Example 1 | 849 | 34 | 29772 | 535 | 7 | 18725 |
| Example 2 | 1197 | 75 | 17950 | 718 | 20 | 10770 |
| Example 3 | 296 | 0 | 17735 | 201 | 0 | 12060 |
| Example 4 | 174 | 0 | 8681 | 125 | 0 | 6250 |
| Example 5 | 511 | 0 | 22985 | 332 | 0 | 14940 |
| Comp. Example 1 | 16 | 0 | 800 | — | — | — |
| Comp. Example 2 | 110 | 0 | 6600 | — | — | — |
| Comp. Example 3 | 456 | 0 | 24181 | 292 | 0 | 15476 |

INDUSTRIAL APPLICABILITY

The ferrite sintered plate and the ferrite sintered sheet according to the present invention have a high electric resistivity as well as a magnetic permeability having a large real part µ' and a small imaginary part µ". Therefore, the ferrite sintered plate and the ferrite sintered sheet can be suitably used as a shielding plate for improving read sensitivity or positional accuracy in a digitizer system.

The invention claimed is:

1. A ferrite sintered plate which has a composition comprising 47 to 50 mol % of $Fe_2O_3$, 7.0 to 15.1 mol % of NiO, 13 to 36 mol % of ZnO, 7.0 to 12 mol % of CuO and 0 to 1.5 mol % of CoO, as calculated in terms of the respective oxides, which has a volume resistivity of $1 \times 10^8$ to $1 \times 10^{12}$ Ω cm and which has a thickness of 10 to 60 µm, wherein the ferrite sintered plate has a magnetic permeability at 500 kHz a real part of which is 296 to 1200 and an imaginary part of which is 0 to 90.

2. The ferrite sintered plate according to claim 1, wherein a product (µm) of the real part of the magnetic permeability at 500 kHz of the ferrite sintered plate and a thickness of the ferrite sintered plate is 7500 to 72000.

3. The ferrite sintered plate according to claim 1, wherein at least one groove is formed on at least one surface of the ferrite sintered plate and the depth of the at least one groove is 1/20 to 1/4 of a thickness of the ferrite sintered plate.

4. A ferrite sintered sheet comprising the ferrite sintered plate according to claim 1, and an adhesive layer or a protective layer which is formed on at least one surface of the ferrite sintered plate.

5. A ferrite sintered sheet comprising the ferrite sintered plate according to claim 1, an adhesive layer formed on one surface of the ferrite sintered plate, and a protective layer formed on the other surface of the ferrite sintered plate.

6. A ferrite sintered sheet comprising the ferrite sintered plate according to claim 1, and adhesive layers respectively formed on opposite surfaces of the ferrite sintered plate.

7. A ferrite sintered sheet comprising the ferrite sintered plate according to claim 1, and protective layers respectively formed on opposite surfaces of the ferrite sintered plate.

8. The ferrite sintered sheet according to claim 4, wherein the ferrite sintered plate is partitioned into small pieces.

9. The ferrite sintered sheet according to claim 8, wherein the ferrite sintered sheet has a magnetic permeability at 500 kHz a real part of which is 120 to 800 and an imaginary part of which is 0 to 30, and a product of the real part of the magnetic permeability at 500 kHz of the ferrite sintered sheet and a thickness of the ferrite sintered plate is 5000 to 48000.

10. A digitizer system comprising a detector and a shielding plate disposed adjacent to the detector, in which the shielding plate is constituted of the ferrite sintered plate according to claim 1.

11. A digitizer system comprising a detector and a shielding plate disposed adjacent to the detector, in which the shielding plate is constituted of the ferrite sintered sheet according to claim 4.

* * * * *